(12) United States Patent
Heo et al.

(10) Patent No.: US 11,230,632 B2
(45) Date of Patent: Jan. 25, 2022

(54) PLASTIC SUBSTRATE AND DISPLAY DEVICE COMPRISING THE SAME

(71) Applicant: SAMSUNG DISPLAY CO., LTD., Yongin-si (KR)

(72) Inventors: Jinnyoung Heo, Asan-si (KR); Sanggu Kim, Seoul (KR); Hyemin Seo, Asan-si (KR); Sungguk An, Suwon-si (KR); Dongjin Jeong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 102 days.

(21) Appl. No.: 16/443,357

(22) Filed: Jun. 17, 2019

(65) Prior Publication Data

US 2019/0312219 A1 Oct. 10, 2019

Related U.S. Application Data

(62) Division of application No. 15/201,327, filed on Jul. 1, 2016, now Pat. No. 10,361,383.

(30) Foreign Application Priority Data

Jul. 6, 2015 (KR) .................. 10-2015-0096040

(51) Int. Cl.
*C08J 7/04* (2020.01)
*C08J 7/046* (2020.01)
(Continued)

(52) U.S. Cl.
CPC .............. *C08J 7/042* (2013.01); *B05D 1/18* (2013.01); *C08G 77/20* (2013.01); *C08J 7/043* (2020.01); *C08J 7/046* (2020.01); *H01L 51/0043* (2013.01); *H01L 51/0094* (2013.01); *H01L 51/0096* (2013.01); *H01L 51/5237* (2013.01);
(Continued)

(58) Field of Classification Search
None
See application file for complete search history.

(56) References Cited

U.S. PATENT DOCUMENTS

| 4,738,509 A | 4/1988 | Broer et al. |
| 5,925,438 A | 7/1999 | Ota et al. |

(Continued)

FOREIGN PATENT DOCUMENTS

| CN | 101687403 A | 3/2010 |
| CN | 104262552 A | 1/2015 |

(Continued)

OTHER PUBLICATIONS

You, He, et al, "Preparation and Performance of UV-Curable Waterborne Fluorinated Acrylate Coatings," Paint & Coatings Industry, vol. 43, No. 8, Aug. 2013, 6 pages, with Abstract.

(Continued)

*Primary Examiner* — Kenneth J Stachel
(74) *Attorney, Agent, or Firm* — Lewis Roca Rothgerber Christie LLP

(57) ABSTRACT

A plastic substrate includes: a transparent plastic support member; a first inorganic layer on a surface of the plastic support member; and a first organic-inorganic hybrid layer on the first inorganic layer. A display device includes a display panel and a window on the display panel, the window including the plastic substrate.

12 Claims, 5 Drawing Sheets

(51) Int. Cl.
  *C08G 77/20* (2006.01)
  *B05D 1/18* (2006.01)
  *C08J 7/043* (2020.01)
  *H01L 51/00* (2006.01)
  *H01L 51/52* (2006.01)
  *H01L 27/32* (2006.01)

(52) U.S. Cl.
  CPC ....... *H01L 51/5256* (2013.01); *C08J 2369/00* (2013.01); *C08J 2433/06* (2013.01); *C08J 2475/04* (2013.01); *C08J 2475/14* (2013.01); *C08J 2483/07* (2013.01); *C08J 2483/08* (2013.01); *H01L 27/3244* (2013.01); *H01L 51/0034* (2013.01); *H01L 2251/303* (2013.01); *H01L 2251/5338* (2013.01)

(56) References Cited

U.S. PATENT DOCUMENTS

| | | | |
|---|---|---|---|
| 6,165,619 A | 12/2000 | Ikenaga et al. | |
| 2003/0108749 A1* | 6/2003 | Ram | C08J 7/046 428/447 |
| 2005/0136269 A1 | 6/2005 | Doehler et al. | |
| 2009/0191391 A1* | 7/2009 | Naito | G02B 1/115 428/216 |
| 2010/0104879 A1 | 4/2010 | Okano | |
| 2012/0107605 A1 | 5/2012 | Ozawa et al. | |
| 2014/0170391 A1 | 6/2014 | Hongo et al. | |
| 2014/0234599 A1 | 8/2014 | Chung et al. | |
| 2015/0225598 A1 | 8/2015 | Kang et al. | |
| 2015/0299507 A1 | 10/2015 | Kang et al. | |
| 2017/0176645 A1* | 6/2017 | Maeda | C08J 7/042 |

FOREIGN PATENT DOCUMENTS

| | | | |
|---|---|---|---|
| EP | 2517878 A1 | 10/2012 | |
| JP | 9-220791 A | 8/1997 | |
| JP | 10-726 A | 1/1998 | |
| JP | 10-225658 A | 8/1998 | |
| JP | 2004-202996 A | 7/2004 | |
| JP | 2005-181548 A | 7/2005 | |
| JP | 2006028688 A | 2/2006 | |
| JP | 2015-521224 A | 7/2015 | |
| KR | 2001-0085131 A | 9/2001 | |
| KR | 10-2014-0027023 A | 3/2014 | |
| KR | 10-2014-0027024 A | 3/2014 | |
| KR | 10-2014-0073265 A | 6/2014 | |
| KR | 10-2014-0147567 A | 12/2014 | |
| WO | 2009/001629 A1 | 12/2008 | |
| WO | WO 2009/134272 A2 | 11/2009 | |
| WO | 2013/171634 A1 | 11/2013 | |
| WO | WO 2015/053500 A1 | 4/2015 | |

OTHER PUBLICATIONS

EPO Extended Search Report dated Dec. 20, 2016, for corresponding European Patent Application No. 16177675.2 (6 pages).

* cited by examiner

PLASTIC SUBSTRATE AND DISPLAY DEVICE COMPRISING THE SAME

CROSS-REFERENCE TO RELATED APPLICATIONS

This application is a divisional of U.S. patent application Ser. No. 15/201,327, filed on Jul. 1, 2016, which claims priority to and the benefit of Korean Patent Application No. 10-2015-0096040, filed on Jul. 6, 2015, in the Korean Intellectual Property Office (KIPO), the entire content of each of which is incorporated herein by reference.

BACKGROUND

1. Field

Aspects of embodiments of the present disclosure relate to a plastic substrate having a hardness substantially the same as that of glass, a method of manufacturing the plastic substrate, and a display device including the plastic substrate.

2. Description of the Related Art

In recent times, with advancement in mobile devices such as a smart phone and a tablet PC, characteristics of slimness and lightweight are desired in a base of display devices. In the mobile display devices, glass having excellent mechanical characteristics and tempered glass are generally used as a front-surface window or a front-surface protecting member. Use of the glass, however, may lead to a high weight of the mobile device due to the weight of the glass, and causes an issue of damage caused by external impacts.

Accordingly, researches are being conducted on plastic materials as a substitute for glass. By virtue of characteristics of the plastic materials, such as relatively light weight and reduced fragility as compared to glass, it is suitable to be used in mobile devices along with the trend toward light-weight mobile devices.

For example, so as to fabricate a plastic material having high hardness and excellent abrasion-resistance, schemes of introducing a hard-coating layer to a plastic base have been suggested. However, there is a difficulty in fabricating a material having a high hardness and an excellent abrasion-resistance equivalent to those of glass using a plastic base.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present disclosure are directed to a plastic substrate having a hardness and an abrasion-resistance substantially equivalent to those of glass and to a method of manufacturing the plastic substrate.

In addition, aspects of embodiments of the present disclosure are directed to a display device including a plastic substrate having a hardness and an abrasion-resistance substantially equivalent to those of glass.

According to an exemplary embodiment of the present disclosure, a plastic substrate includes: a transparent plastic support member; a first inorganic layer on a surface of the plastic support member; and a first organic-inorganic hybrid layer on the first inorganic layer. The first inorganic layer may include silicon oxide ($SiO_x$) and a silicone polymer having a polymer linker connected to the silicon oxide ($SiO_x$), and the first organic-inorganic hybrid layer may include a polymer resin and inorganic particles dispersed in the polymer resin.

The silicone polymer may include at least one selected from a repeating unit represented by the following Chemical Formula 1 and a repeating unit represented by the following Chemical Formula 2.

Chemical Formula 1

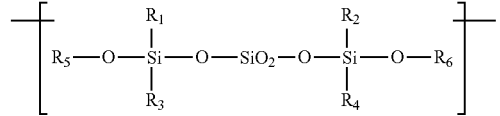

In Chemical Formula 1, each of R1, R2, R3, and R4 may be one selected from an amino group, an epoxy group, a phenyl group, an acrylic polymerizing group, and a vinyl polymerizing group, at least one selected from R1, R2, R3, and R4 may be one selected from an acrylic polymerizing group and a vinyl polymerizing group, and Each of R5 and R6 may be one selected from hydrogen (H) and a hydrocarbon group having 1 to 6 carbon atoms.

Chemical Formula 2

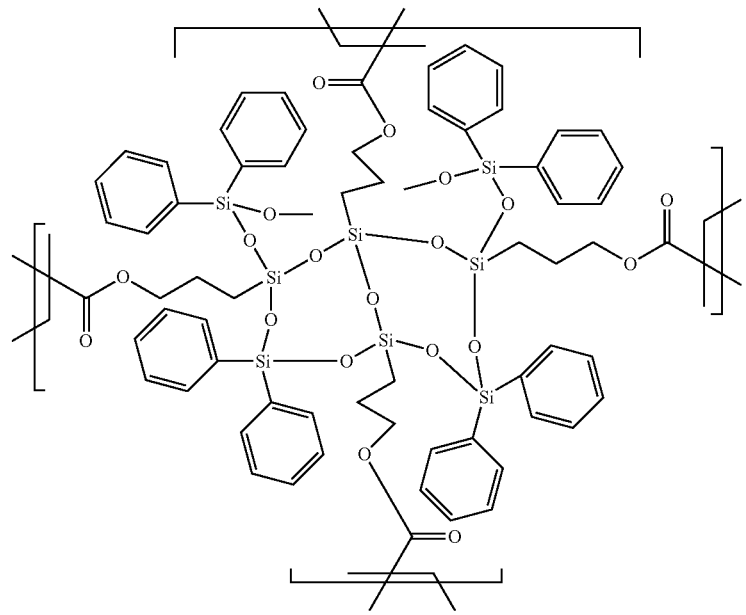

The polymer linker may include one selected from a polymerizing unit represented by the following Chemical Formula 3 and a polymerizing unit represented by the following Chemical Formula 4.

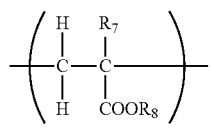

Chemical Formula 3

In Chemical Formula 3, R7 may be hydrogen (H) or a methyl group, and R8 may be connected to Si and may include a hydrocarbon group having 1 to 6 carbon atoms.

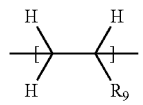

Chemical Formula 4

In Chemical Formula 4, R9 may be connected to Si and may include a hydrocarbon group having 1 to 6 carbon atoms.

The polymer linker may be present in an amount of about 5 wt % to about 15 wt % with respect to the total weight of the first inorganic layer.

The first inorganic layer may have a thickness of about 3 μm to about 10 μm.

The plastic support member may include one selected from the group consisting of: a polyethylene (PE) film, a polypropylene (PP) film, a polyamide (PA) film, a polyacetal (polyoxymethylene, POM) film, a polymethyl methacrylate (PMMA) film, a polyethylene terephthalate (PET) film, a polybutylene terephthalate (PBT) film, a polycarbonate (PC) film, a cellulose film, and a moisture-resistant cellophane.

The plastic support member may include a copolymer of polycarbonate (PC) and polymethyl methacrylate (PMMA), and polycarbonate (PC) may be present in an amount of about 50 wt % to about 70 wt % and polymethyl methacrylate (PMMA) may be present in an amount of about 30 wt % to about 50 wt %, with respect to the total weight of the copolymer of polycarbonate (PC) and polymethyl methacrylate (PMMA).

The plastic support member may have a thickness of about 400 μm to about 1000 μm.

The polymer resin may include at least one selected from an acrylic resin, a urethane resin and a urethane-acrylate resin.

The inorganic particle may include at least one selected from a silica particle, zirconium oxide (e.g., $ZrO_x$), aluminum oxide (e.g., $Al_2O_3$), tantalum oxide (e.g., $TaO_x$), and nickel oxide (e.g., $NiO_x$).

The inorganic particle may be present in an amount of about 30 wt % to about 50 wt % with respect to the total weight of the first organic-inorganic hybrid layer.

The first organic-inorganic hybrid layer may further include fluorine (F) in an amount of about 0.001 wt % to about 0.2 wt % with respect to the total weight of the first organic-inorganic hybrid layer.

The first organic-inorganic hybrid layer may have a thickness of about 5 μm to about 15 μm.

The plastic substrate may further include a first organic layer in one selected from positions of: between the plastic support member and the first inorganic layer and between the first inorganic layer and the first organic-inorganic hybrid layer.

The first organic layer may include at least one selected from an acrylic resin, a urethane resin, and a urethane-acrylate resin.

The first organic layer may have a thickness of about 5 μm to about 10 μm.

The plastic substrate may further include: a second inorganic layer on another surface of the plastic support member; and a second organic-inorganic hybrid layer on the second inorganic layer. The second inorganic layer may have a composition the same (e.g., substantially the same) as that of the first inorganic layer and the second organic-inorganic hybrid layer may have a composition the same (e.g., substantially the same) as that of the first organic-inorganic hybrid layer.

The plastic substrate may further include a second organic layer in one selected from positions of: between the plastic support member and the second inorganic layer and between the second inorganic layer and the second organic-inorganic hybrid layer.

According to another exemplary embodiment of the present disclosure, a method of manufacturing a plastic substrate includes: immersing a transparent plastic support member in a coating solution for forming an inorganic layer and thereby forming a first inorganic layer and a second inorganic layer on both sides of the plastic support member, respectively; and immersing the plastic support member formed with the first inorganic layer and the second inorganic layer in a coating solution for forming an organic-inorganic hybrid layer and thereby forming a first organic-inorganic hybrid layer and a second organic-inorganic hybrid layer on the first inorganic layer and the second inorganic layer, respectively. The coating solution for forming an inorganic layer may include a silicone monomer including a silicon oxide moiety and a coupling moiety, and the coating solution for forming an organic-inorganic hybrid layer may include an organic binder component and inorganic particles dispersed in the organic binder component.

The silicone monomer may include at least one selected from a monomer represented by the following Chemical Formula 5 and a monomer represented by the following Chemical Formula 6.

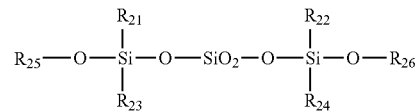

Chemical Formula 5

In Chemical Formula 5, each of R21, R22, R23, and R24 may be one selected from an amino group, an epoxy group, a phenyl group, an acrylic group, and a vinyl group, at least one selected from R21, R22, R23, and R24 may be one selected from an acrylic group and a vinyl group, and each of R25 and R26 may be one selected from hydrogen (H) and a hydrocarbon group having 1 to 6 carbon atoms.

Chemical Formula 6

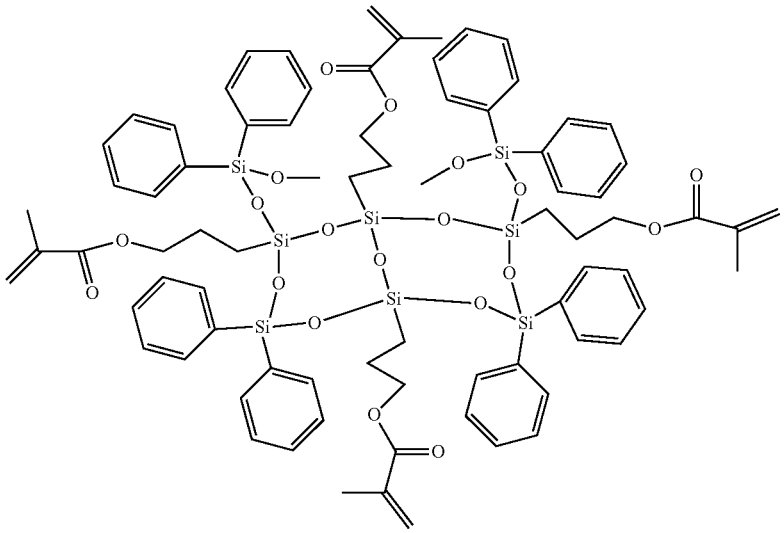

The coupling moiety may be present in an amount of about 5 wt % to about 15 wt % with respect to the total weight of the coating solution for forming an inorganic layer.

The forming of the inorganic layer may include: immersing the plastic support member in the coating solution for forming an inorganic layer and thereby forming an inorganic coating layer on the plastic support member; and thermal-curing the inorganic coating layer.

The thermal-curing may be performed at a temperature of about 60° C. to about 120° C.

The plastic support member may include one selected from the group consisting of: a polyethylene (PE) film, a polypropylene (PP) film, a polyamide (PA) film, a polyacetal (polyoxymethylene, POM) film, a polymethyl methacrylate (PMMA) film, a polyethylene terephthalate (PET) film, a polybutylene terephthalate (PBT) film, a polycarbonate (PC) film, a cellulose film, and a moisture-resistant cellophane.

The plastic support member may include a copolymer of polycarbonate (PC) and polymethyl methacrylate (PMMA), and polycarbonate (PC) may be present in an amount of about 50 wt % to about 70 wt % and polymethyl methacrylate (PMMA) may be present in an amount of about 30 wt % to about 50 wt %, with respect to the total weight of the copolymer of polycarbonate (PC) and polymethyl methacrylate (PMMA).

The binder component may include a monomer, an oligomer, and a photoinitiator, and the monomer may include at least one selected from an acrylic monomer and a urethane monomer.

The inorganic particle may include at least one selected from a silica particle, zirconium oxide (e.g., $ZrO_x$), aluminum oxide (e.g., $Al_2O_3$), tantalum oxide (e.g., $TaO_x$), and nickel oxide (e.g., $NiO_x$).

The inorganic particle may be present in an amount of about 30 wt % to about 50 wt % with respect to the total weight of the coating solution for forming an organic-inorganic hybrid layer.

The coating solution for forming an organic-inorganic hybrid layer may further include fluorine (F) in an amount of about 0.001 wt % to about 0.2 wt % with respect to the total weight of the coating solution for forming an organic-inorganic hybrid layer.

The method may further include forming an organic layer on the plastic support member prior to or subsequent to the forming of the inorganic layer.

The organic layer may include at least one selected from an acrylic resin, a urethane resin, and a urethane-acrylate resin.

According to another exemplary embodiment of the present disclosure, a display device including a display panel and a window on the display panel. The window includes: a transparent plastic support member; a first inorganic layer on a surface of the plastic support member; and a first organic-inorganic hybrid layer on the first inorganic layer. The first inorganic layer may include silicon oxide and a silicone polymer having a polymer linker connected to the silicon oxide, and the first organic-inorganic hybrid layer may include a polymer resin and inorganic particles dispersed in the polymer resin.

The silicone polymer may include at least one selected from a repeating unit represented by the above Chemical Formula 1 and a repeating unit represented by the above Chemical Formula 2.

The polymer linker may include one selected from a polymerizing unit represented by the above Chemical Formula 3 and a polymerizing unit represented by the above Chemical Formula 4.

The display device may further include a first organic layer in one selected from positions of: between the plastic support member and the first inorganic layer and between the first inorganic layer and the first organic-inorganic hybrid layer.

The display device may further include: a second inorganic layer on another surface of the plastic support member; and a second organic-inorganic hybrid layer on the second inorganic layer. The second inorganic layer may have a composition the same (e.g., substantially the same) as that of the first inorganic layer and the second organic-inorganic hybrid layer may have a composition the same (e.g., substantially the same) as that of the first organic-inorganic hybrid layer.

The display device may further include a second organic layer in one selected from positions of: between the plastic support member and the second inorganic layer and between the second inorganic layer and the second organic-inorganic hybrid layer.

The display panel may be one selected from a liquid crystal display ("LCD") panel and an organic light emitting diode ("OLED") display panel.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure will be more clearly understood from the following detailed description taken in conjunction with the accompanying drawings, in which.

DETAILED DESCRIPTION

Figure 1:
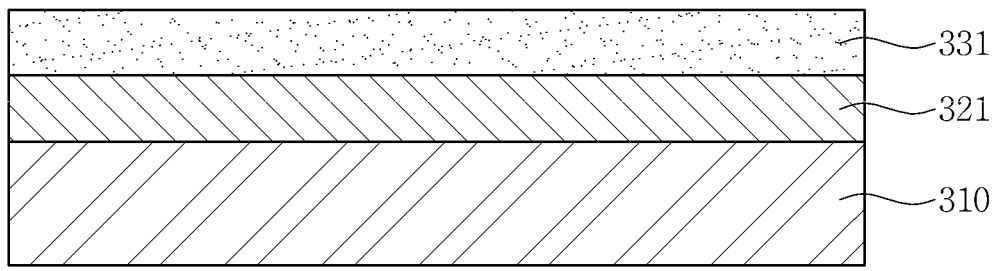
FIG. 1 is a cross-sectional view illustrating a plastic substrate according to a first exemplary embodiment.

Hereinafter, embodiments of the present disclosure will now be described in more detail with reference to the accompanying drawings. The subject matter of the present disclosure may, however, be embodied in many different forms and should not be construed as being limited to the embodiments set forth herein. Rather, these embodiments are provided so that this disclosure will be thorough and complete, and will fully convey the scope of the present disclosure to those skilled in the art.

All terminologies used herein are merely used to describe embodiments of the inventive concept and may be modified according to the relevant art and the intention of an applicant. Therefore, the terms used herein should be interpreted as having a meaning that is consistent with their meanings in the context of the present disclosure, and is not intended to limit the subject matter of the present disclosure.

In the drawings, certain elements or shapes may be simplified or exaggerated to better illustrate embodiments of the present disclosure, and other elements present in an actual product may also be omitted. Thus, the drawings are intended to facilitate the understanding of embodiments of the present disclosure. Like reference numerals refer to like elements throughout the specification.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, acts, operations, elements, and/or components, but do not preclude the presence or addition of one or more other features, integers, acts, operations, elements, components, and/or groups thereof.

In the drawings, the thickness of layers and regions may be exaggerated for clarity. In addition, when a layer is described to be formed on another layer or on a substrate, this means that the layer may be formed on the other layer or on the substrate, or a third layer may be interposed between the layer and the other layer or the substrate. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, unless otherwise stated, "inorganic layer" may refer to one selected from a first inorganic layer and a second inorganic layer, or both of the first inorganic layer and the second inorganic layer. Likewise, unless otherwise stated, "organic-inorganic hybrid layer" may refer to one selected from a first organic-inorganic hybrid layer and a second organic-inorganic hybrid layer, or both of the first organic-inorganic hybrid layer and the second organic-inorganic hybrid layer, and "organic layer" may refer to one selected from a first organic layer and a second organic layer, or both of the first organic layer and the second organic layer.

Hereinafter, a first exemplary embodiment will be described with reference to FIG. 1.

FIG. 1 is a cross-sectional view illustrating a plastic substrate 101 according to the first exemplary embodiment.

The plastic substrate 101 according to the first exemplary embodiment includes a plastic support member 310 having a light-transmitting characteristic (e.g., a transparent plastic support member), a first inorganic layer 321 on a surface of the plastic support member 310, and a first organic-inorganic hybrid layer 331 on the first inorganic layer 321.

The first inorganic layer 321 includes silicon oxide ($SiO_x$, $0<x\leq2$) and a silicone polymer having a polymer linker connected to the silicon oxide ($SiO_x$, $0<x\leq2$). For example, in some embodiments, the silicone polymer is chemically bonded to the silicon oxide. In addition, the first organic-inorganic hybrid layer 331 includes a polymer resin and inorganic particles dispersed in the polymer resin.

According to the first exemplary embodiment, a light-transmissive plastic film may be used as the plastic support member 310 on which the first inorganic layer 321 and the first organic-inorganic hybrid layer 331 are disposed.

A polyethylene (PE) film, a polypropylene (PP) film, a polyamide (PA) film, a polyacetal (polyoxymethylene, POM) film, a polymethyl methacrylate (PMMA) film, a polyethylene terephthalate (PET) film, a polybutylene terephthalate (PBT) film, a polycarbonate (PC) film, a cellulose film, a moisture-resistant cellophane, and/or the like, each having a light-transmitting characteristic, may be used as the plastic support member 310.

The plastic support member 310 may use a plastic film including a carbonate group represented by the following Chemical Formula 7.

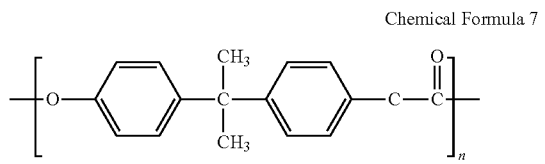

Chemical Formula 7

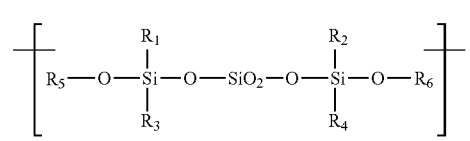

Chemical Formula 1

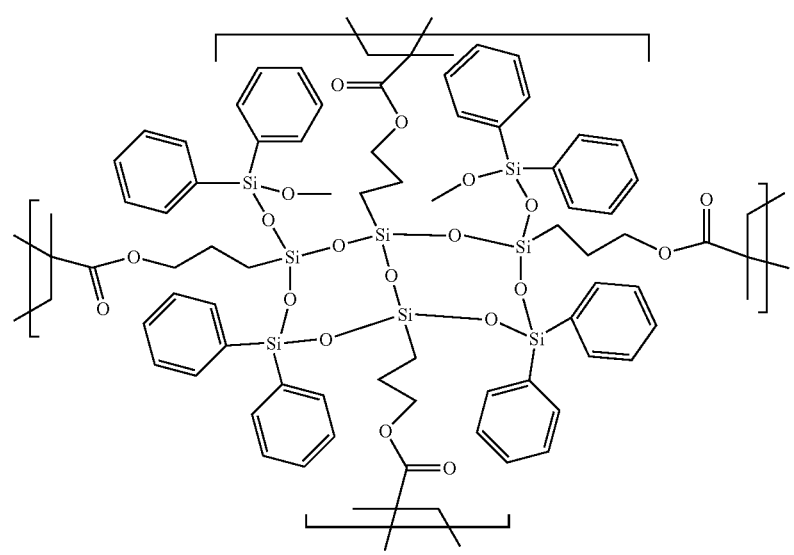

Chemical Formula 2

A C=O group and a C—H group of the carbonate group, either alone or in combination, exhibit high affinity for an acrylic group and/or the like of the first inorganic layer 321, and thus the plastic support member 310 may have a strong bonding force with the first inorganic layer 321.

For example, a plastic film including a copolymer of polycarbonate (PC) and polymethyl methacrylate (PMMA) may be used as the plastic support member 310. In such an embodiment, polycarbonate (PC) is present in an amount of about 50 wt % to about 70 wt % and polymethyl methacrylate (PMMA) is present in an amount of about 30 wt % to about 50 wt %, with respect to the total weight of the copolymer of polycarbonate (PC) and polymethyl methacrylate (PMMA). In more detail, a copolymer of which a content ratio (e.g., a weight ratio) in terms of polycarbonate (PC) to polymethyl methacrylate (PMMA) is about 6:4 may be used as the plastic support member 310.

The plastic support member 310 may have a thickness of about 400 µm to about 1000 µm. In a case where the thickness of the plastic support member 310 is less than about 400 µm, the support strength of the plastic support member 310 may decrease, and in a case where the thickness thereof is more than about 1000 µm, it is disadvantageous to achieve thinness of an element (e.g., the plastic support member 310 is too thick).

The first inorganic layer 321 includes silicon oxide ($SiO_x$, $0<x\leq2$) and a silicone polymer having a polymer linker connected to the silicon oxide ($SiO_x$, $0<x\leq2$).

The silicone polymer may include at least one selected from a repeating unit represented by the following Chemical Formula 1 and a repeating unit represented by the following Chemical Formula 2.

In Chemical Formula 1, each of R1, R2, R3, and R4 is one selected from an amino group, an epoxy group, a phenyl group, an acrylic polymerizing group, and a vinyl polymerizing group, at least one selected from R1, R2, R3, and R4 is one selected from an acrylic polymerizing group and a vinyl polymerizing group, and each of R5 and R6 is one selected from hydrogen (H) and a hydrocarbon group having 1 to 6 carbon atoms.

As used herein, the term "acrylic polymerizing group" refers to a polymerizing unit of an acrylic moiety formed through polymerization of the acrylic group, and the term "vinyl polymerizing group" refers to a polymerizing unit of a vinyl moiety formed through polymerization of the vinyl group.

The acrylic polymerizing group may be represented by the following Chemical Formula 3, and the vinyl polymerizing group may be represented by the following Chemical Formula 4.

Since at least one selected from R1, R2, R3, and R4 is one selected from the acrylic polymerizing group and the vinyl polymerizing group, the repeating units represented by Chemical Formula 1 are connected to one another, thus forming a silicone polymer.

In more detail, the repeating unit represented by Chemical Formula 1 may be formed through polymerization of a coating solution (a coating composition) for forming an inorganic layer that is a mixture of silicon oxide (SiO$_x$, 0<x≤2) and an organic coupling agent.

The silicon oxide (SiO$_x$, 0<x≤2) may be represented by SiO$_2$ or SiO$_3$, and the polymer linker connected to the silicon oxide may be one selected from a connecting group represented by the following Chemical Formula 3 and a connecting group represented by the following Chemical Formula 4.

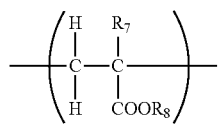

Chemical Formula 3

Chemical Formula 3 represents an acrylic polymerizing group, and in Chemical Formula 3, R7 is hydrogen (H) or a methyl group, R8 is connected to Si and includes a hydrocarbon group having 1 to 6 carbon atoms.

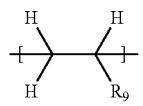

Chemical Formula 4

Chemical Formula 4 is a vinyl polymerizing group, and in Chemical Formula 4, R9 is connected to Si and includes a hydrocarbon group having 1 to 6 carbon atoms.

In addition, Chemical Formula 2 is a repeating unit of the silicone polymer having an acrylic polymerizing group.

The polymer linker included in the first inorganic layer 321 has high affinity for the C═O group and the C—H group of the plastic support member 310, and allows the plastic support member 310 and the first inorganic layer 321 to have a strong bonding force. For example, a hydrogen bond may be formed between the polymer linker of the first inorganic layer 321 and the C═O group or the C—H group of the plastic support member 310 (e.g., a hydrogen bond may be formed between a hydrogen atom of the polymer linker of the first inorganic layer 321 and the C═O group or the C—H group of the plastic support member 310), and Van Der Waals force may be generated.

The polymer linker may be present in an amount of about 5 wt % to about 15 wt % with respect to the total weight of the first inorganic layer 321. In a case where the polymer linker is less than about 5 wt %, it may be difficult to form the silicone polymer, and in a case where the polymer linker is more than about 15 wt %, the hardness of the first inorganic layer 321 may decrease.

The first inorganic layer 321 may have a thickness of about 3 μm to about 10 μm. In a case where the first inorganic layer 321 has a thickness less than about 3 μm, the hardness of the plastic substrate 101 may decrease. In addition, in a case where the first inorganic layer 321 has a thickness more than about 10 μm, it is disadvantageous in achieving thinness of an element (e.g., the first inorganic layer 321 is too thick).

The first organic-inorganic hybrid layer 331 includes a polymer resin and inorganic particles dispersed in the polymer resin.

The polymer resin used in the formation of the first organic-inorganic hybrid layer 331 has a light-transmitting characteristic, and the type (or kind) of the polymer resin is not particularly limited. The polymer resin may use, for example, one selected from an acrylic resin, a urethane resin and a urethane-acrylate resin.

The first organic-inorganic hybrid layer 331 may be formed through polymerization and curing of a coating solution (a coating composition) for forming an organic-inorganic hybrid layer including an organic binder component and inorganic particles dispersed in the organic binder component. The coating solution (the coating composition) for forming an organic-inorganic hybrid layer is described in more detail below.

The type (or kind) of the inorganic particle is not particularly limited. The inorganic particle may use (e.g., include), for example, a silica particle, zirconium oxide (e.g., ZrO$_2$), aluminum oxide (e.g., Al$_2$O$_3$), tantalum oxide (e.g., Ta$_2$O$_5$), nickel oxide (e.g., NiO), and the like.

The inorganic particle is present in an amount of about 30 wt % to about 50 wt % with respect to the total weight of the first organic-inorganic hybrid layer 331. In more detail, in the first organic-inorganic hybrid layer 331, the polymer resin and the inorganic particle may have a content ratio (weight ratio) of about 6:4. In a case where the inorganic particles included in the first organic-inorganic hybrid layer 331 are present in an amount less than about 30 wt %, the hardness of the first organic-inorganic hybrid layer 331 may decrease. In a case where the inorganic particles are present in an amount more than about 50 wt %, there is a difficulty in forming a stable layer.

In addition, the first organic-inorganic hybrid layer 331 may further include fluorine (F) in an amount of about 0.001 wt % to about 0.2 wt % with respect to the total weight of the first organic-inorganic hybrid layer 331. In this case, the fluorine (F) may serve as an additive in a small amount. With addition of fluorine (F), the hardness of the first organic-inorganic hybrid layer 331 may increase.

The first organic-inorganic hybrid layer 331 has a thickness of about 5 μm to about 15 μm. In a case where the first organic-inorganic hybrid layer 331 has a thickness less than about 5 μm, the first organic-inorganic hybrid layer 331 may experience difficulty in having a sufficient (or suitable) hardness, and in a case where the first organic-inorganic hybrid layer 331 has a thickness more than about 15 μm, it is disadvantageous in achieving thinness of an element (e.g., the first organic-inorganic hybrid layer 331 is too thick).

Hereinafter, a second exemplary embodiment will be described with reference to FIG. 2. Hereinafter, in order to avoid repetition, descriptions with regard to configurations described in the foregoing will not be repeated.

Figure 2:
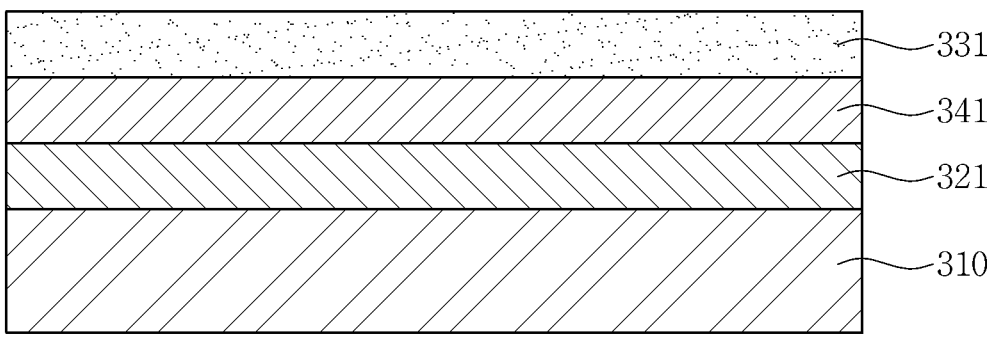
FIG. 2 is a cross-sectional view illustrating a plastic substrate according to a second exemplary embodiment.

FIG. 2 is a cross-sectional view illustrating a plastic substrate 102 according to the second exemplary embodiment.

The plastic substrate 102 according to the second exemplary embodiment includes a plastic support member 310 having a light-transmitting characteristic, a first inorganic layer 321 on a surface of the plastic support member 310, a first organic layer 341 on the first inorganic layer 321, and a first organic-inorganic hybrid layer 331 on the first organic layer 341.

The first organic layer 341 may include at least one selected from an acrylic resin, a urethane resin and a urethane-acrylate resin.

The first organic layer 341 may be formed through curing of a coating solution (a coating composition) for forming an organic layer. The coating solution (the coating composition) for forming an organic layer is described in more detail below.

The first organic layer 341 is disposed between the first inorganic layer 321 and the first organic-inorganic hybrid layer 331 to serve as a buffer with respect to stress caused among the layers. The first organic layer 341 may form a hydrogen bond with an OH group of a polymer component included in the first inorganic layer 321 and the first organic-inorganic hybrid layer 331, and Van Der Waals force may be generated thereamong. For example, a hydrogen atom of the first organic layer 341 may form a hydrogen bond with an OH group of a polymer component included in the first inorganic layer 321 and the first organic-inorganic hybrid layer 331.

The first organic layer 341 has a thickness of about 5 μm to about 10 μm. In a case where the thickness of the first organic layer 341 is less than about 5 μm, buffer effects may hardly occur among the layers, and in a case where the thickness thereof is more than about 10 μm, it is disadvantageous in achieving thinness of an element (e.g., the first organic layer 341 is too thick).

Hereinafter, a third exemplary embodiment will be described with reference to FIG. 3.

Figure 3:
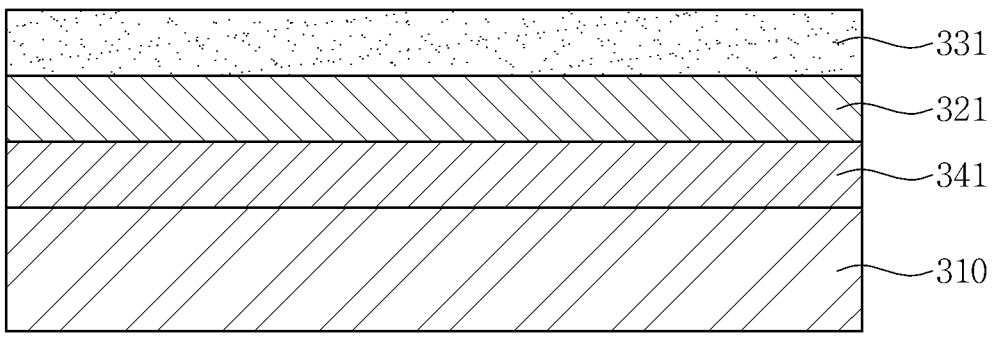
FIG. 3 is a cross-sectional view illustrating a plastic substrate according to a third exemplary embodiment.

FIG. 3 is a cross-sectional view illustrating a plastic substrate 103 according to the third exemplary embodiment.

The plastic substrate 103 according to the third exemplary embodiment includes a plastic support member 310 having a light-transmitting characteristic, a first organic layer 341 on a surface of the plastic support member 310, a first inorganic layer 321 on the first organic layer 341, and a first organic-inorganic hybrid layer 331 on the first inorganic layer 321.

The plastic substrate 103 according to the third exemplary embodiment is the same as the plastic substrate 102 according to the second exemplary embodiment, except for the position of the first organic layer 341. The first organic layer 341 is disposed between the plastic support member 310 and the first inorganic layer 321 to serve as a buffer with respect to stress caused among the layers.

Hereinafter, a fourth exemplary embodiment will be described with reference to FIG. 4.

Figure 4:
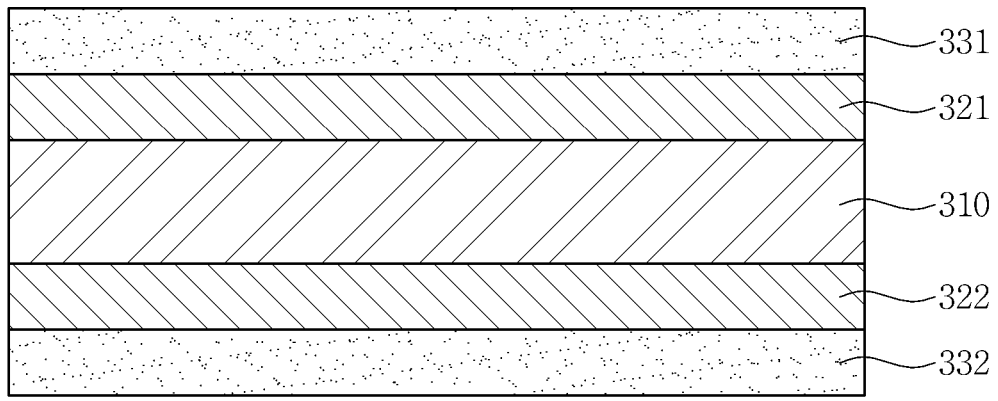
FIG. 4 is a cross-sectional view illustrating a plastic substrate according to a fourth exemplary embodiment.

FIG. 4 is a cross-sectional view illustrating a plastic substrate 104 according to the fourth exemplary embodiment.

The plastic substrate 104 according to the fourth exemplary embodiment includes a plastic support member 310 having a light-transmitting characteristic, a first inorganic layer 321 and a second inorganic layer 322 that are disposed on both sides of the plastic support member 310, respectively, and a first organic-inorganic hybrid layer 331 and a second organic-inorganic hybrid layer 332 on the first inorganic layer 321 and the second inorganic layer 322, respectively.

The plastic substrate 104 according to the fourth exemplary embodiment further includes the second inorganic layer 322 on another surface (e.g., a second surface) of the plastic support member 310 and the second organic-inorganic hybrid layer 332 on the second inorganic layer 322 as compared to the plastic substrate 101 according to the first exemplary embodiment.

The second inorganic layer 322 has a composition the same (e.g., substantially the same) as that of the first inorganic layer 321, and the second organic-inorganic hybrid layer 332 has a composition the same (e.g., substantially the same) as that of the first organic-inorganic hybrid layer 331.

Hereinafter, a fifth exemplary embodiment will be described with reference to FIG. 5.

Figure 5:
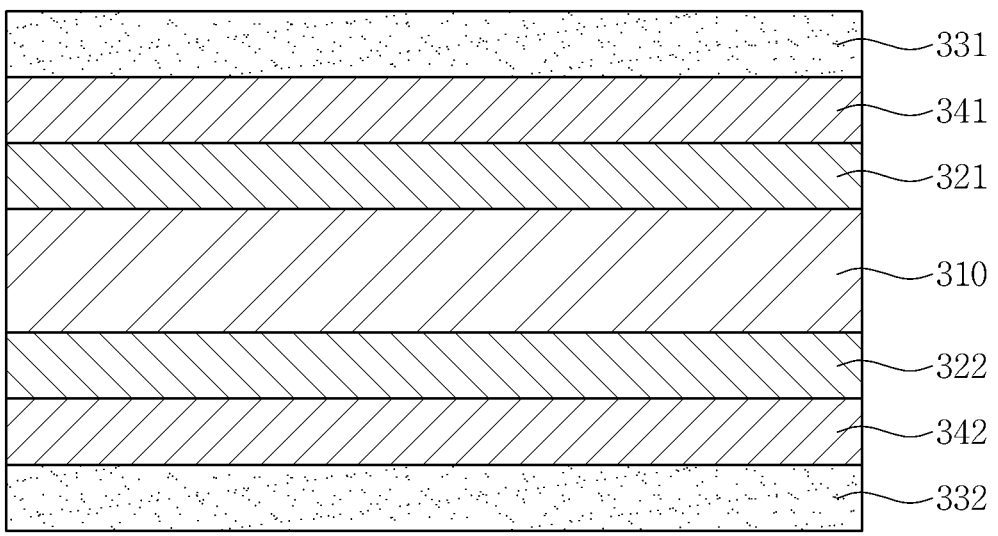
FIG. 5 is a cross-sectional view illustrating a plastic substrate according to a fifth exemplary embodiment.

FIG. 5 is a cross-sectional view illustrating a plastic substrate 105 according to the fifth exemplary embodiment.

The plastic substrate 105 according to the fifth exemplary embodiment further includes a first organic layer 341 between a first inorganic layer 321 and a first organic-inorganic hybrid layer 331 and a second organic layer 342 between a second inorganic layer 322 and a second organic-inorganic hybrid layer 332, as compared to the plastic substrate 104 according to the fourth exemplary embodiment. The first inorganic layer 321 and the second inorganic layer 322 are on respective surfaces of the plastic support member 310.

Hereinafter, a sixth exemplary embodiment will be described with reference to FIG. 6.

Figure 6:
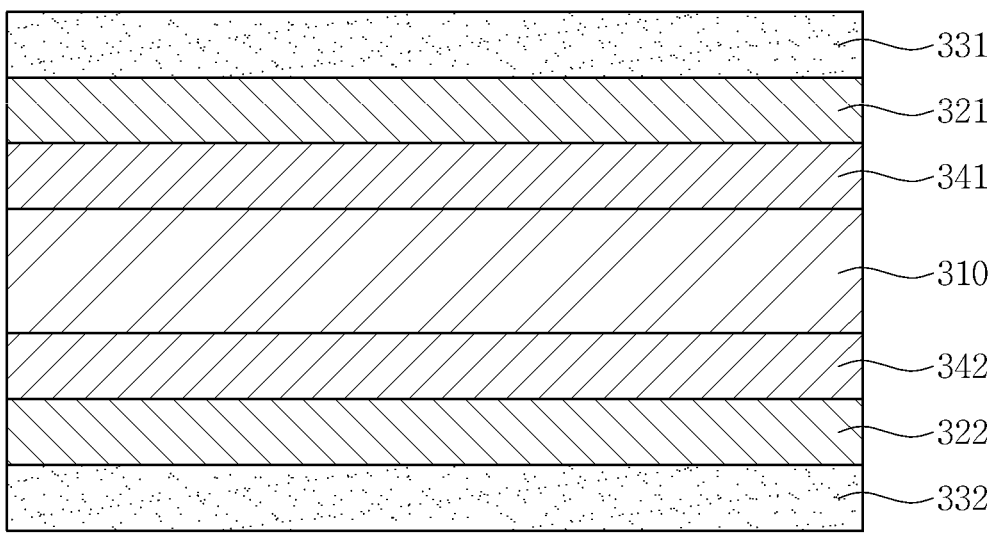
FIG. 6 is a cross-sectional view illustrating a plastic substrate according to a sixth exemplary embodiment.

FIG. 6 is a cross-sectional view illustrating a plastic substrate 106 according to the sixth exemplary embodiment.

The plastic substrate 106 according to the sixth exemplary embodiment further includes a first organic layer 341 between a plastic support member 310 and a first inorganic layer 321 and a second organic layer 342 between the plastic support member 310 and a second inorganic layer 322, as compared to the plastic substrate 104 according to the fourth exemplary embodiment. The plastic substrate 106 further includes the first organic-inorganic hybrid layer 331 and the second organic-inorganic hybrid layer 332.

Hereinafter, a method of manufacturing the plastic substrate according to an exemplary embodiment will be described. In more detail, a method of manufacturing the plastic substrate 104 according to the fourth exemplary embodiment through a dip coating method will be described.

In order to form the plastic substrate 104, the plastic support member 310 having a light-transmitting characteristic is immersed in the coating solution (the coating composition) for forming an inorganic layer to thereby form the first inorganic layer 321 and the second inorganic layer 322 on both sides of the plastic support member 310, respectively, and subsequently, the plastic support member 310 formed with the first inorganic layer 321 and the second inorganic layer 322 is immersed in the coating solution (the coating composition) for forming an organic-inorganic hybrid layer to thereby form the first organic-inorganic hybrid layer 331 on the first inorganic layer 321 and the second organic-inorganic hybrid layer 332 on the second inorganic layer 322.

The first inorganic layer 321 and the second inorganic layer 322 may also be collectively referred to as inorganic layers 321 and 322, and the first organic-inorganic hybrid layer 331 and the second organic-inorganic hybrid layer 332 may also be collectively referred to as organic-inorganic hybrid layers 331 and 332. Through the dip coating process, the inorganic layers 321 and 322 and the organic-inorganic hybrid layers 331 and 332 are formed on the both sides of the plastic support member 310.

The plastic support member 310 includes one selected from the group consisting of: a polyethylene (PE) film, a polypropylene (PP) film, a polyamide (PA) film, a polyacetal (polyoxymethylene, POM) film, a polymethyl methacrylate (PMMA) film, a polyethylene terephthalate (PET) film, a polybutylene terephthalate (PBT) film, a polycarbonate (PC) film, a cellulose film, and a moisture-resistant cellophane. The plastic support member 310 may include a combination of the foregoing. As used herein, the terms "combination thereof" and "combinations thereof" may refer to a chemical combination (e.g., an alloy or chemical compound), a mixture, or a laminated structure of components. For example, a copolymer of polycarbonate (PC) and polymethyl methacrylate (PMMA) in which polycarbonate (PC) is present in an amount of about 50 wt % to about 70 wt % and polymethyl methacrylate (PMMA) is present in an amount of about 30 wt % to about 50 wt % with respect to the total weight of the copolymer of polycarbonate (PC) and polymethyl methacrylate (PMMA) may be used as the plastic support member 310.

The forming of the inorganic layers 321 and 322 includes immersing the plastic support member 310 in the coating solution (the coating composition) for forming an inorganic layer to thereby form inorganic coating layers on the both sides of the plastic support member 310 and thermal-curing the inorganic coating layers.

The coating solution (the coating composition) for forming an inorganic layer includes a silicone monomer including a silicon oxide ($SiO_x$, $0<x\leq2$) moiety and a coupling moiety. The coupling moiety may include, for example, an epoxy group, a phenyl group, an acrylic group, and a vinyl group.

Examples of the silicone monomer including silicon oxide ($SiO_x$, $0<x\leq2$) and a coupling moiety may include a monomer represented by the following Chemical Formula 5 and a monomer represented by the following Chemical Formula 6, which may be used solely or in combination with each other.

The coating solution (the coating composition) for forming an inorganic layer in which a silicon-based inorganic material and a coupling moiety are mixed has a form of a hybrid sol, and the hybrid sol may be formed by mixing an organic coupling agent (e.g., a composition including the coupling moiety) and silicon oxide ($SiO_x$, $0<x\leq2$), for example, silica ($SiO_2$).

In more detail, the coating solution (the coating composition) for forming an inorganic layer may be formed by mixing an alkoxysilane-based silicon oxide ($SiO_2$) and an organic silane-based chemical composition. Herein, the alkoxysilane-based silicon oxide ($SiO_2$) provides silicon and the organic silane-based chemical composition provides a polymerizing group.

The organic silane-based chemical composition may include one selected from an acrylic group, a vinyl group, and a phenyl group, and may be bonded with silicon oxide ($SiO_2$). The acrylic group increases adhesion and density of the inorganic layers 321 and 322, the vinyl group increases flexibility, and the phenyl group increases thermal-resistance.

Chemical Formula 5

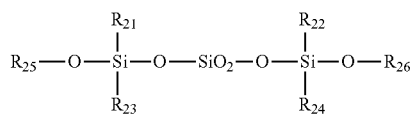

Chemical Formula 6

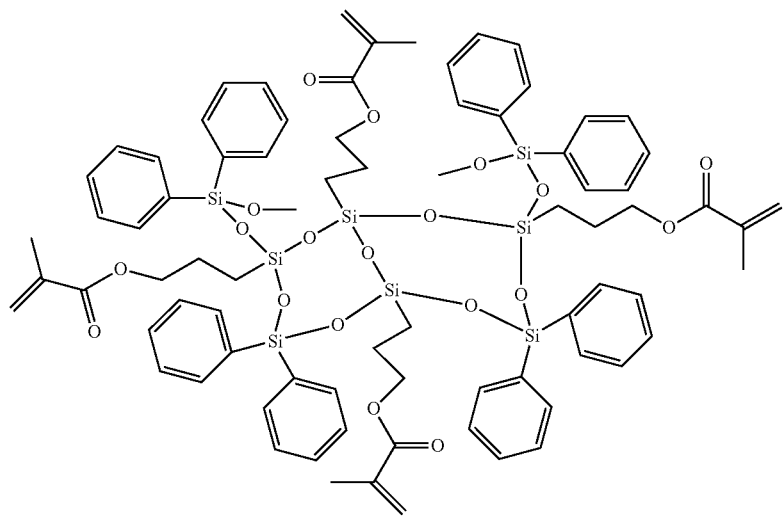

In Chemical Formula 5, each of R21, R22, R23, and R24 is one selected from an amino group, an epoxy group, a phenyl group, an acrylic group, and a vinyl group. At least one selected from R21, R22, R23, and R24 is one selected from an acrylic group and a vinyl group. Each of R25 and R26 is one selected from hydrogen (H) and a hydrocarbon group having 1 to 6 carbon atoms.

In Chemical Formula 5, R21, R22, R23, and R24 correspond to the coupling moiety, and in Chemical Formula 6, an acrylic group bonded with silicon corresponds to the coupling moiety.

The coupling moiety is present in an amount of about 5 wt % to about 15 wt % with respect to the total weight of the coating solution (the coating composition) for forming an inorganic layer.

Subsequently to forming the inorganic coating layer on the both sides of the plastic support member 310 by immersing the plastic support member 310 in the coating solution (the coating composition) for forming an inorganic layer, the inorganic coating layer is thermally-cured. In this case, the thermal-curing may be performed at a relatively low temperature. For example, the thermal-curing may be performed at a temperature of about 60° C. to about 120° C.

In a case where such a coating solution (a coating composition) for forming an inorganic layer is used, the inorganic layer may be formed without employing schemes such as sputtering or deposition that are performed at a high temperature. Accordingly, damages to the plastic support member 310 due to heat may be prevented or reduced.

The forming of the organic-inorganic hybrid layers 331 and 332 includes: immersing the plastic support member 310 formed with the inorganic layers 321 and 322 in the coating solution (the coating composition) for forming an organic-inorganic hybrid layer to thereby form a coating layer for forming an organic-inorganic hybrid layer on both sides of the inorganic layers 321 and 322, and photo-curing the coating layer for forming an organic-inorganic hybrid layer. In this case, ultraviolet (UV) light irradiation may be utilized for the photo-curing.

The coating solution (the coating composition) for forming an organic-inorganic hybrid layer includes an organic binder component and inorganic particles dispersed in the organic binder component.

The organic binder component includes a monomer, an oligomer, and a photoinitiator, for example, a photopolymerization initiator. The monomer may include at least one selected from an acrylic monomer and a urethane monomer. The organic binder component may be used to form the organic layers 341 and 342.

The organic binder component may include a monomer in an amount of about 20 wt % to about 60 wt %, an oligomer in an amount of about 20 wt % to about 60 wt, a rubber-based elastic component in an amount of about 10 wt % to about 50 wt %, and a photoinitiator in an amount of about 1 wt % to about 10 wt %, where the wt % may be based on the total weight of the organic binder component.

The monomer may use a monofunctional monomer and/or a polyfunctional monomer.

The monofunctional monomer may include an acrylic monomer such as nonylphenyl carbitol acrylate, 2-hydroxy-3-phenoxypropyl acrylate, 2-ethylhexyl carbitol acrylate, 2-hydroxyethyl acrylate, and the like. In addition, a vinyl-based monomer such as N-vinylpyrrolidone may be added thereto.

The polyfunctional monomer having two or more reactive groups may include an acrylic monomer such as 1,6-hexanediol di (meth) acrylate, ethylene glycol di (meth) acrylate, neopentyl glycol di (meth) acrylate, triethylene glycol di (meth) acrylate, 3-methyl pentanediol di (meth) acrylate, and the like.

In addition, the polyfunctional monomer may include trimethylolpropane tri (meth) acrylate, ethoxylated trimethylolpropane tri (meth) acrylate, propoxylated trimethylolpropane tri (meth) acrylate, pentaerythritol tri (meth) acrylate, pentaerythritol tetra (meth) acrylate, dipentaerythritol penta (meth) acrylate, ethoxylated dipentaerythritol hexa (meth) acrylate, propoxylated di pentaerythritol hexa (meth) acrylate, dipentaerythritol hexa (meth) acrylate, and the like.

According to exemplary embodiments of the present disclosure, "(meth)acrylate" may refer to one selected from acrylate and methacrylate or may refer to both acrylate and methacrylate.

The monomer may be used solely or in combination of two or more kinds thereof.

The oligomer may use or include urethane (meth)acrylate having a weight-average molecular weight (Mw) of about 5,000 to about 50,000.

In a case where the weight-average molecular weight (Mw) of the oligomer is more than about 50,000, white turbidity may occur in a high temperature, high humidity environment. In a case where the weight-average molecular weight (Mw) of the oligomer is less than about 5,000, the coating solution (the coating composition) for forming an organic-inorganic hybrid layer may experience difficulty in maintaining a solid state at room temperature.

The urethane (meth) acrylate may be formed by reaction of a polyol compound having two or more hydroxyl groups in the molecule, a compound having two or more isocyanate groups in the molecule, and (meth) acrylate having one or more hydroxyl groups in the molecule.

The polyol compound having two or more hydroxyl groups in the molecule may include, for example, polyether polyol, polyester polyol, caprolactone diol, bisphenol polyol, polyisoprene polyol, hydrogenated polyisoprene polyol, polybutadiene polyol, hydrogenated polybutadiene polyol, castor oil polyol, and/or polycarbonate diol, which may be used solely or in combination of two or more thereof.

The compound having two or more isocyanate groups in the molecule may include, for example, aromatic polyisocyanate, alicyclic polyisocyanate, and aliphatic polyisocyanate, which may be used solely or in combination of two or more thereof.

The (meth) acrylate having at least one hydroxyl group in the molecule may include: for example, mono(meth)acrylate of dihydric alcohols, such as ethylene glycol, propylene glycol, 1,3-propanediol, 1,3-butanediol, 1,4-butanediol, and polyethylene glycol; mono(meth)acrylate of trihydric alcohols, such as trimethylolethane, trimethylolpropane, and glycerin; and/or di(meth)acrylate, which may be used solely or in combination of two or more thereof.

The oligomer, for example, may use silicone acrylate represented by the following Chemical Formula 8:

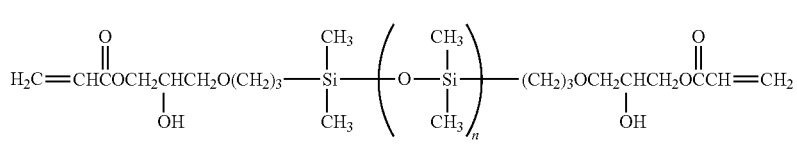

Chemical Formula 8

In Chemical Formula 8, n is an integer in a range of 5 to 50.

The silicone acrylate represented by Chemical Formula 8 includes silicon (Si) and has excellent affinity for the inorganic layers 321 and 322.

The rubber-based elastic component may include at least one selected from polybutadiene and polyisoprene each having a weight-average molecular weight (Mw) of about 10,000 to about 100,000. The rubber-based elastic component may impart elasticity to the coating solution (the coating composition) for forming an organic-inorganic hybrid layer. In a case where the rubber-based elastic component has a weight-average molecular weight (Mw) of about 10,000 to about 100,000, the coating solution (the coating composition) for forming an organic-inorganic hybrid may have stable fluidity.

The photoinitiator may absorb activation energy rays, such as UV rays, to generate a radical (or radicals). The radical generated from the photoinitiator may react with the monomer and/or the oligomer to initiate a polymerization reaction of an adhesive composition. Along with the polymerization reaction, a cross-linking reaction may occur among the monomer, the oligomer, and the rubber-based elastic component. Through the polymerization reaction and the cross-linking reaction, the coating solution (the coating composition) for forming an organic-inorganic hybrid layer is cured to thereby form the organic-inorganic hybrid layer.

The inorganic particle may include at least one selected from a silica particle, zirconium oxide (e.g., $ZrO_x$), aluminum oxide ($Al_2O_3$), tantalum oxide (e.g., $TaO_x$), and nickel oxide (e.g., $NiO_x$). The inorganic particle is present in an amount of about 30 wt % to about 50 wt % with respect to the total weight of the coating solution (the coating composition) for forming an organic-inorganic hybrid layer.

In addition, the coating solution (the coating composition) for forming an organic-inorganic hybrid layer may further include fluorine (F) in an amount of about 0.001 wt % to about 0.2 wt % with respect to the total weight of the coating solution (the coating composition) for forming an organic-inorganic hybrid layer.

Fluorine (F) is provided in a form of a chemical composition represented by the following Chemical Formula 9, and may be included in the coating solution (the coating composition) for forming an organic-inorganic hybrid layer.

$$R_{31}\text{-}(CF_2O)_m(CF_2CF_2O)_nCF_2\text{-}R_{32} \quad \text{Chemical Formula 9}$$

In Chemical Formula 9, each of R31 and R32 includes a hydrocarbon group having 1 to 6 carbon atoms, and m and n each independently are integers in a range of 1 to 20.

As the inorganic layers 321 and 322 and the organic-inorganic hybrid layers 331 and 332 are formed on the both sides of the plastic support member 310, the plastic substrate 104 illustrated in FIG. 4 is manufactured.

In addition, subsequently to forming the inorganic layers 321 and 322 on the both sides of the plastic support member 310 and prior to forming the organic-inorganic hybrid layers 331 and 332, the organic layers 341 and 342 may be formed on the inorganic layers 321 and 322. In this case, the plastic substrate 105 illustrated in FIG. 5 may be manufactured.

Herein, the first organic layer 341 on the first inorganic layer 321 and the second organic layer 342 on the second inorganic layer 322 are collectively referred as organic layers 341 and 342, which will be the same hereinbelow.

Meanwhile, prior to forming the inorganic layers 321 and 322 on the both sides of the plastic support member 310, the organic layers 341 and 342 may be formed on the both sides of the plastic support member 310, and the inorganic layers 321 and 322 and the organic-inorganic hybrid layers 331 and 332 may be sequentially formed thereon. In this case, the plastic substrate 106 illustrated in FIG. 6 may be manufactured.

The organic layers 341 and 342 may be formed through a dip coating method using the coating solution (the coating composition) for forming an organic layer formed of an organic binder component.

The coating solution (the coating composition) for forming an organic layer may use an organic binder component used for manufacturing the coating solution (the coating composition) for forming an organic-inorganic hybrid layer.

For example, the organic binder component for forming the organic layer includes a monomer, an oligomer, and a photoinitiator. The monomer may include at least one selected from an acrylic monomer and a urethane monomer. In more detail, the coating solution (the coating composition) for forming an organic layer may include a monomer in an amount of about 20 wt % to about 60 wt %, an oligomer in an amount of about 20 wt % to about 60 wt, a rubber-based elastic component in an amount of about 10 wt % to about 50 wt %, and a photoinitiator in an amount of about 1 wt % to about 10 wt %, where the foregoing wt % may be based on the total weight of the coating solution.

The organic layers 341 and 342 formed in such a manner include at least one selected from an acrylic resin, a urethane resin, and a urethane-acrylate resin. The organic layers 341 and 342, for example, may include a chemical composition represented by the following Chemical Formula 10.

Chemical Formula 10

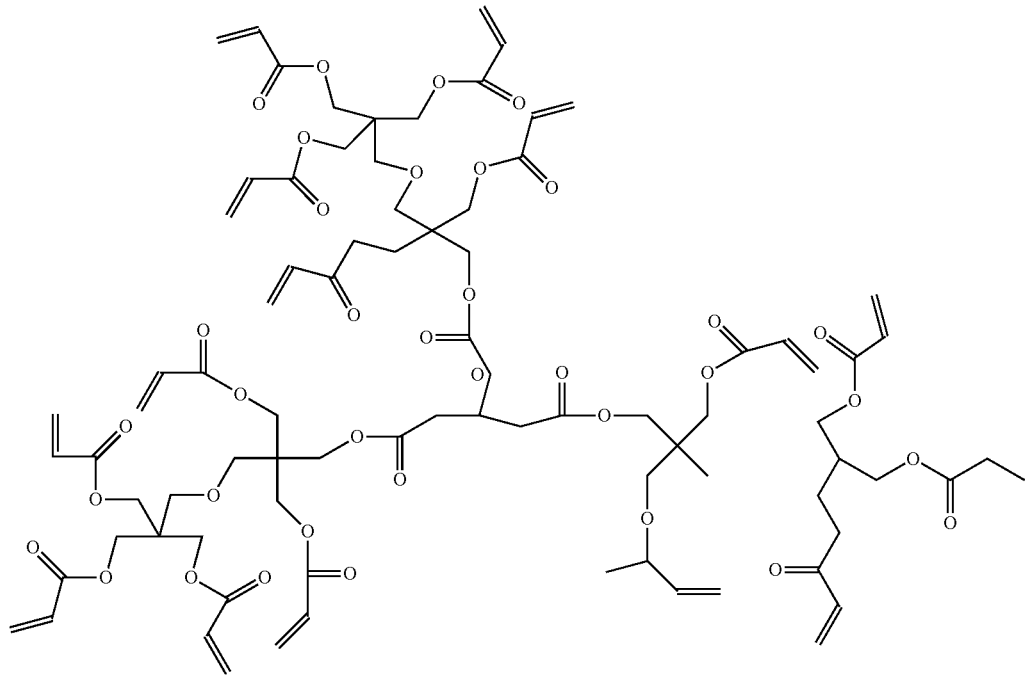

An acrylic group of the organic layers 341 and 342 exhibits excellent affinity for the plastic support member 310 and the inorganic layers 321 and 322 and for the organic-inorganic hybrid layers 331 and 332. For example, the organic layers 341 and 342 and the organic-inorganic hybrid layers 331 and 332 may form a bond represented by the following Chemical Formula 11 at an interface.

Chemical Formula 11

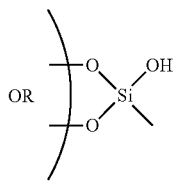

In Chemical Formula 11, "OR" represents the organic layers 341 and 342. The organic layers 341 and 342 may bond with a silica particle (Si—O) included in the organic-inorganic hybrid layers 331 and 332.

Through such a bond, the hardness of the coating layers including the inorganic layer, the organic layer, and the organic-inorganic hybrid layer may be improved.

Hereinafter, evaluation of the physical properties of the plastic substrates 104, 105 and 106 according to the fourth, fifth, and sixth exemplary embodiments will be described. An experimental sample including the plastic substrate 104 according to the fourth exemplary embodiment is referred to as "experimental example 1," an experimental sample including the plastic substrate 105 according to the fifth exemplary embodiment is referred to as "experimental example 2," and an experimental sample including the plastic substrate 106 according to the sixth exemplary embodiment is referred to as "experimental example 3."

In the experimental samples of the experimental examples 1, 2, and 3, a plastic support member 310 is a polycarbonate (PC) film having a thickness of about 550 μm, inorganic layers 321 and 322 are layers having the repeating unit represented by Chemical Formula 2, organic-inorganic hybrid layers 331 and 332 are layers including a polymer resin, containing urethane acrylate, in an amount of about 60 wt % (e.g., based on the total weight of the organic-inorganic hybrid layers) and silica particles, dispersed in the polymer resin, in an amount of about 40 wt %, and organic layers 341 and 342 are urethane-acrylate layers.

In more detail, the experimental sample of the experimental example 1 has a structure in which an organic-inorganic hybrid layer having a thickness of about 10 μm, an inorganic layer having a thickness of about 5 μm, a plastic support member having a thickness of about 550 μm, an inorganic layer having a thickness of about 5 μm, and an organic-inorganic hybrid layer having a thickness of about 10 μm are sequentially disposed.

The experimental sample of the experimental example 2 has a structure in which an organic-inorganic hybrid layer having a thickness of about 5 μm, an organic layer having a thickness of about 10 μm, an inorganic layer having a thickness of about 5 μm, a plastic support member having a thickness of about 550 μm, an inorganic layer having a thickness of about 5 μm, an organic layer having a thickness of about 10 μm, and an organic-inorganic hybrid layer having a thickness of about 5 μm are sequentially disposed.

The experimental sample of the experimental example 3 has a structure in which an organic-inorganic hybrid layer having a thickness of about 5 μm, an inorganic layer having a thickness of about 10 μm, an organic layer having a thickness of about 5 μm, a plastic support member having a thickness of about 550 μm, an organic layer having a thickness of about 5 μm, an inorganic layer having a thickness of about 10 μm, and an organic-inorganic hybrid layer having a thickness of about 5 μm are sequentially disposed.

For comparison, a plastic substrate including only a polycarbonate (PC) film having a thickness of about 550 μm (comparative example 1), a plastic substrate including organic-inorganic hybrid layers having a thickness of about 10 μm formed on both sides of a polycarbonate (PC) film having a thickness of about 550 μm through a dip coating method (comparative example 2), and a plastic substrate including organic-inorganic hybrid layers having a thickness of about 20 μm formed on both sides of a polycarbonate (PC) film having a thickness of about 550 μm through a spray coating method (comparative example 3) are used.

In order to evaluate physical properties, pencil hardness, scratch-resistance, impact-resistance, and optical properties of the plastic substrate are measured. The detailed methods of measurement will be described hereinbelow.

1) Pencil Hardness

An experimental sample having a size of 150 mm×100 mm is manufactured using a plastic substrate, the pencil hardness is measured five times on the experimental sample with respect to a weight of 1 kg in accordance with the pencil hardness test specified in JIS K 5600-5-4, and the smallest value is selected as a pencil hardness of the experimental sample.

In the pencil hardness, the reference numerals "H," "F," and "B," initials of "hard," "firm," and "black," respectively, represent hardness and concentration. As a number of an "H" lead or a "B" lead increases, the "H" lead becomes harder, whereas the "B" lead becomes smoother. For example, "9H" denotes a highest hardness, and the hardness decreases in the following order: 8H, 7H, 6H, 5H, 4H, 3H, 2H, H, F, B, 2B, 3B, 4B, 5B, 6B, 7B, 8B, and 9B.

2) Scratch-Resistance Characteristic

An experimental sample having a size of 200 mm×200 mm is manufactured using a plastic substrate, and a cylinder, having a diameter of about 25 mm, of which a flat surface is uniformly attached with a steel wool #0000 is prepared. Subsequently, a surface of the experimental sample is rubbed with the cylinder attached with the steel wool #0000 thirty times with a weight of 1.0 kg at a speed of about 100 mm a second, and the number of scratches appearing on the surface of the experimental sample is identified with the unaided eye. In a case where the number of scratches is 2 or less, it is evaluated as "○," in a case where the number of scratches is more than 2 and less than 5, it is evaluated as "Δ," and in a case where the number of scratches is 5 or more, it is evaluated as "x."

3) Impact-Resistance Characteristic

An iron ball of 22 g is spaced apart from the experimental sample to be dropped thereto so as to identify whether a crack occurs. The dropping of the iron ball is repeatedly carried out while increasing a dropping height of the iron ball to verify a dropping height that causes a crack. The dropping height of the iron ball is increased from 5 cm to 20 cm.

4) Optical Properties

Transmittance, reflectivity, and haze are measured using a spectrophotometer (device name: "COH-400").

The results from measurement of material properties are shown in Table 1.

TABLE 1

| Category | Experimental example 1 | Experimental example 2 | Experimental example 3 | Comparative example 1 | Comparative example 2 | Comparative example 3 |
|---|---|---|---|---|---|---|
| Pencil hardness | 7H | 8H | 6H | 1H | 4H | 4H |
| Scratch-resistance | ◯ | ◯ | ◯ | X | Δ | Δ |
| Impact-resistance | 20 cm drop No crack | 20 cm drop No crack | 15 cm drop No crack | 10~15 cm Crack occurs | 10~15 cm Crack occurs | 10~15 cm Crack occurs |
| Haze (%) | 3.43 | 3.18 | 3.33 | — | 4.32 | 5.42 |
| Transmittance (%) | 91.9 | 91.5 | 91.2 | 90.2 | 90.9 | 90.9 |
| Reflectivity (%) | 7.3 | 7.2 | 7.3 | 9.3 | 8.1 | 8.1 |

In reference to Table. 1, it is verified that the experimental samples of the experimental examples 1, 2, and 3 according to the fourth, fifth, and sixth exemplary embodiments have a pencil hardness of 6H or more, and have excellent scratch-resistance and excellent impact-resistance. Accordingly, the plastic substrates 104, 105, and 106 according to the fourth, fifth, and sixth exemplary embodiments have mechanical properties substantially equivalent to those of glass. Further, the experimental samples of the experimental examples 1, 2, and 3 have excellent optical properties.

Figure 7:
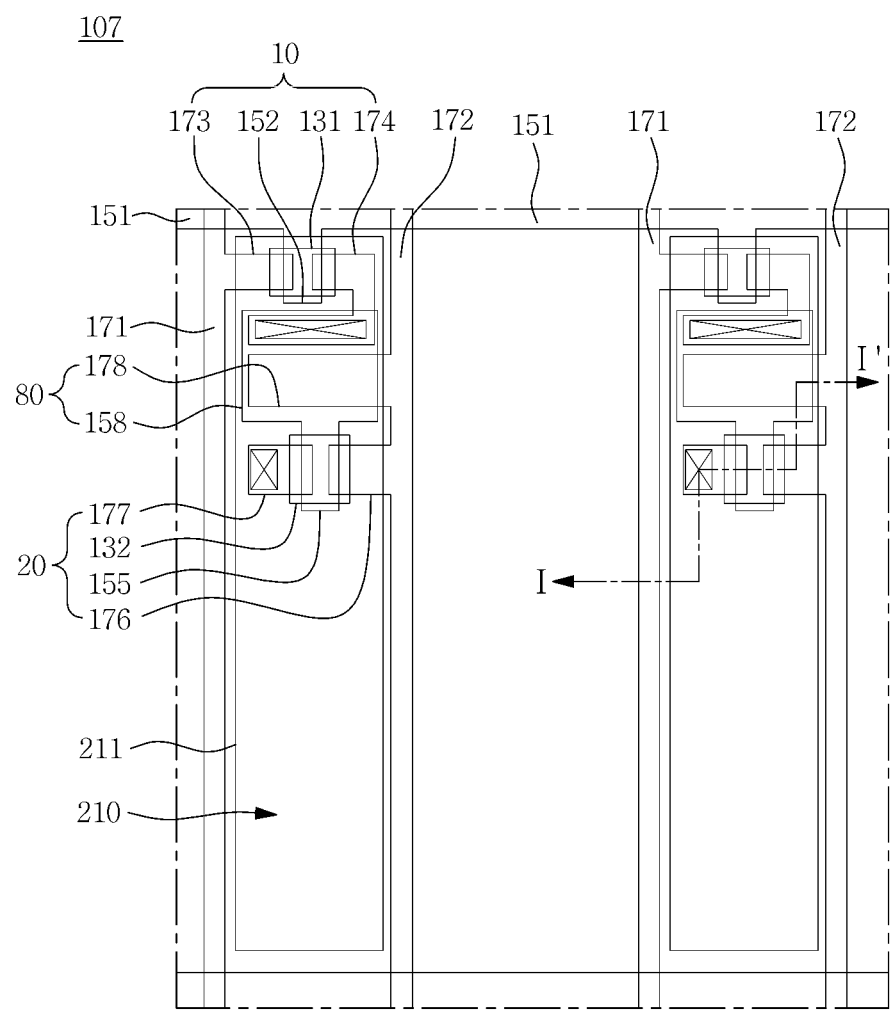
FIG. 7 is a plan view illustrating a display device according to a seventh exemplary embodiment.
Figure 8:
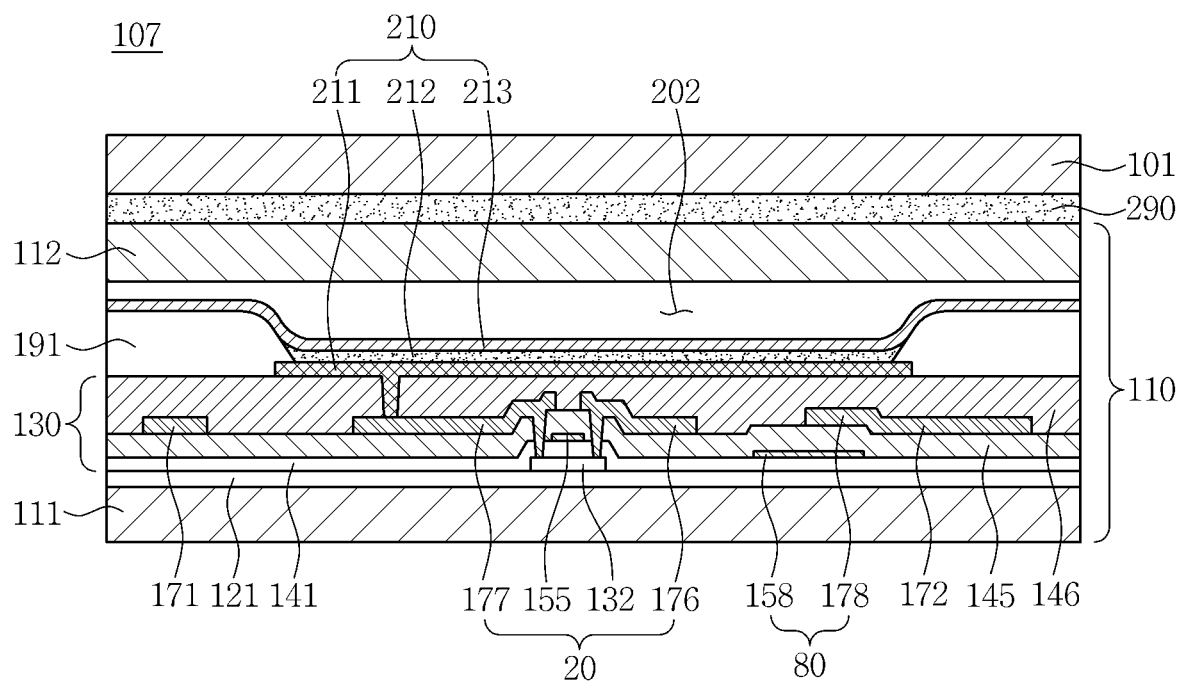
FIG. 8 is a cross-sectional view taken along line I-I' of FIG. 7.

Hereinafter, a display device 107 according to a seventh exemplary embodiment will be described with reference to FIGS. 7 and 8. FIG. 7 is a plan view illustrating a display device according to the seventh exemplary embodiment; and FIG. 8 is a cross-sectional view taken along line I-I' of FIG. 7.

The display device 107 according to the seventh exemplary embodiment includes a display panel 110, an adhesive layer 290 on the display panel 110, a plastic substrate 101 on the adhesive layer 290. In the seventh exemplary embodiment, the plastic substrate 101 on the adhesive layer 290 is a window protecting the display panel 110.

The display panel 110 is configured to display images. The display panel 110 is not particularly limited. For example, the display panel 110 may use a self-emission-type display panel (a self-emission kind of display panel) such as an organic light emitting display panel or a non-emission-type display panel (a non-emission kind of display panel) such as a liquid crystal display ("LCD") panel, an electrowetting display panel, an electrophoretic display panel ("EPD"), or a microelectromechanical system ("MEMS") display panel. In a case where the non-emission-type display panel (the non-emission kind of display panel) is used, the display device may include a backlight unit configured to provide light to the display panel 110.

Meanwhile, a polarizer may be disposed between the display panel 110 and the plastic substrate 101. The polarizer may prevent or reduce reflection of externally incident light (external light) from the display panel 110 so as not to be perceived by a user.

In addition, the display device 107 may further include a touch screen panel. For example, the touch screen panel may be disposed between the display panel 110 and the polarizer.

According to the seventh exemplary embodiment, the display panel 110 may use an organic light emitting display panel. Accordingly, the display device according to the seventh exemplary embodiment is an organic light emitting diode ("OLED") display device, but the seventh exemplary embodiment is not limited thereto.

As illustrated in FIGS. 7 and 8, the display panel 110 includes a first substrate 111, a wiring unit 130, an OLED 210, and a second substrate 112.

The first substrate 111 may include an insulating material including one selected from the group consisting of: glass, quartz, ceramic, plastic and the like. In an exemplary embodiment, the first substrate 111 may be formed of a metal material such as stainless steel.

A buffer layer 121 is disposed on the first substrate 111. The buffer layer 121 may include one or more layer selected from various suitable inorganic layers and organic layers. The buffer layer 121 may significantly reduce infiltration of undesirable elements such as moisture into the wiring unit 130 or the OLED 210 and also planarize a surface. However, the buffer layer 121 may not be invariably necessary, and may be omitted.

The wiring unit 130 is disposed on the buffer layer 121. The wiring unit 130 is a portion including a switching thin film transistor ("TFT") 10, a driving TFT 20, and a capacitor 80, and is configured to drive the OLED 210. The OLED 210 may display an image by emitting light based on a driving signal applied from the wiring unit 130.

FIGS. 7 and 8 illustrate an active-matrix-type (an active-matrix kind of) organic light emitting diode ("AMOLED") display having a 2Tr-1Cap structure, which includes two TFTs, for example the switching TFT 10 and the driving TFT 20, and the capacitor 80 in each pixel. However, the display device according to the seventh exemplary embodiment is not limited thereto. For example, the OLED display device 107 may include three or more TFTs and two or more capacitors 80 in each pixel, and may further include additional wirings to have various suitable structures. Herein, the term "pixel" refers to the smallest unit for displaying an image, and the display area displays an image using a plurality of pixels.

Each of the pixels includes the switching TFT 10, the driving TFT 20, the capacitor 80, and the OLED 210. In addition, a gate line 151 disposed along one direction and a data line 171 and a common power line 172 insulated from and intersecting the gate line 151 are disposed on the wiring unit 130. Herein, each pixel may be defined by the gate line 151, the data line 171, and the common power line 172, but is not limited thereto. The pixel may be defined by a pixel defining layer (PDL) or a black matrix.

The OLED 210 may include a first electrode 211, an organic light emitting layer 212 formed on the first electrode 211, and a second electrode 213 formed on the organic light emitting layer 212. Holes and electrons are injected to the organic light emitting layer 212 from the first electrode 211 and the second electrode 213, respectively. The injected holes and electrons are combined with each other to form an exciton, and then light is emitted by energy generated when the exciton falls (e.g., relaxes) from an excited state to a ground state.

The capacitor 80 includes a pair of storage electrodes 158 and 178 with an insulating interlayer 145 interposed therebetween. Herein, the insulating interlayer 145 may include a dielectric material. Capacitance of the capacitor 80 is determined by electric charges accumulated in the capacitor 80 and voltage across the pair of storage electrodes 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177. The semiconductor layers 131 and 132 and the gate electrodes 152 and 155 are insulated from a gate insulating layer 141.

The switching TFT 10 may function as a switching element which selects a pixel to perform light emission. The switching gate electrode 152 is connected to the gate line 151, and the switching source electrode 173 is connected to the data line 171. The switching drain electrode 174 is spaced apart from the switching source electrode 173 and connected to one of the storage electrodes 158.

The driving TFT 20 may apply a driving power to the first electrode 211, which serves as a pixel electrode, so as to allow the organic light emitting layer 212 of the OLED 210 in a selected pixel to emit light. The driving gate electrode 155 is connected to the storage electrode 158 that is connected to the switching drain electrode 174. The driving source electrode 176 and the other of the storage electrodes 178 each are connected to the common power line 172.

With the above-described structure, the switching TFT 10 may be operated by a gate voltage applied to the gate line 151 and may function to transmit, to the driving TFT 20, a data voltage applied to the data line 171. Voltage equivalent to a difference between a common voltage applied from the common power line 172 to the driving TFT 20 and the data voltage transmitted from the switching TFT 10 may be stored in the capacitor 80, and current corresponding to the voltage stored in the capacitor 80 may flow to the OLED 210 through the driving TFT 20, so that the OLED 210 may emit light.

Herein, the first electrode 211 is an anode serving as a hole injection electrode, and the second electrode 213 is a cathode serving as an electron injection electrode. However, the seventh exemplary embodiment is not limited thereto. For example, the first electrode 211 may be a cathode and the second electrode 213 may be an anode.

A planarization layer 146 is disposed on the insulating interlayer 145. The planarization layer 146 may be formed of an insulating layer, and protect the wiring unit 130. The planarization layer 146 and the insulating interlayer 145 may be formed of the same (e.g., substantially the same) material.

The driving drain electrode 177 of the driving TFT 20 is connected to the first electrode 211 of the OLED 210 through a contact hole defined in the planarization layer 146.

According to the seventh exemplary embodiment, the first electrode 211 is a reflective electrode and the second electrode 213 is a transflective electrode. Accordingly, light emitted from the organic light emitting layer 212 may be transmitted through the second electrode 213 to be emitted.

So as to form the reflective electrode and the transflective electrode, one or more metal selected from: magnesium (Mg), silver (Ag), gold (Au), calcium (Ca), lithium (Li), chromium (Cr), aluminum (Al), and copper (Cu), or an alloy thereof may be used. In this regard, whether the electrode is a reflective type (a reflective kind) or a transflective type (a transflective kind) may be determined based on a thickness of the electrode. In general, the transflective layer has a thickness of 200 nm or less. As the thickness of the transflective layer decreases, a level of light transmittance may increase, and as the thickness thereof increases, the light transmittance may decrease.

In more detail, the first electrode 211 may include a reflective layer including at least one metal selected from magnesium (Mg), silver (Ag), gold (Au), calcium (Ca), lithium (Li), chromium (Cr), aluminum (Al), and copper (Cu), and a transparent conductive layer disposed on the reflective layer. Herein, the transparent conductive layer may include a transparent conductive oxide (TCO), for example, at least one selected from indium tin oxide (ITO), indium zinc oxide (IZO), zinc oxide (ZnO), aluminum zinc oxide (AZO), and indium oxide ($In_2O_3$). Since such a transparent conductive layer has a relatively high work function, hole injection through the first electrode 211 may be readily performed.

In addition, the first electrode 211 may have a triple-layer structure in which a transparent conductive layer, a reflective layer, and a transparent conductive layer are sequentially stacked.

The second electrode 213 may include a transflective layer including at least one metal of magnesium (Mg), silver (Ag), gold (Au), calcium (Ca), lithium (Li), chromium (Cr), aluminum (Al), and copper (Cu).

In some embodiments, at least one selected from a hole injection layer (HIL) and a hole transporting layer (HTL) may further be disposed between the first electrode 211 and the organic light emitting layer 212. In addition, at least one selected from an electron transporting layer (ETL) and an electron injection layer (EIL) may further be disposed between the organic light emitting layer 212 and the second electrode 213.

The organic light emitting layer 212, the HIL, the HTL, the ETL, and the EIL may be collectively referred to as an organic layer. Such an organic layer may be formed of a low molecular weight organic material or a polymer organic material.

The pixel defining layer 191 has an aperture. The aperture of the pixel defining layer 191 exposes a portion of the first electrode 211. The first electrode 211, the organic light emitting layer 212, and the second electrode 213 are sequentially stacked in the aperture of the pixel defining layer 191. The second electrode 213 may be disposed on the organic light emitting layer 212 and on the pixel defining layer 191. The OLED 210 emits light from the organic light emitting layer 212 disposed in the aperture of the pixel defining layer 191. Accordingly, the pixel defining layer 191 may define a light emission area.

In some embodiments, a capping layer may further be disposed on the second electrode 213. The capping layer may protect the OLED 210.

In order to protect the OLED 210, a second substrate 112 is disposed on the OLED 210 to face the first substrate 111. The second substrate 112 may be formed of the same (e.g., substantially the same) material as a material forming the first substrate 111. The first substrate 111 and the second substrate 112 may be sealed by a sealant.

Meanwhile, a buffer member 202 is disposed between the OLED 210 and the second substrate 112. The buffer member 202 may protect interior components, such as the OLED 210, from impact that may be externally imposed to the OLED display device 107. The buffer member 202 may enhance device reliability of the OLED display device 107. The buffer member 202 may include at least one of an organic sealant, such as a urethane-based resin, an epoxy-based resin, and an acrylic resin, or an inorganic sealant, such as silicon (or silicone).

The adhesive layer 290 is disposed on the display panel 110, and the plastic substrate 101 is disposed on the adhesive layer 290. A side of the plastic substrate 101 on which the first inorganic layer 321 and the first organic-inorganic hybrid layer 331 are disposed is opposite to a side on which the display panel 110 is disposed.

The plastic substrate 101 may serve as a window protecting the display panel 110.

However, the seventh exemplary embodiment is not limited thereto, and the plastic substrates 102, 103, 104, 105, and 106 according to the second to sixth exemplary embodiments may be used as the window.

Figure 9:
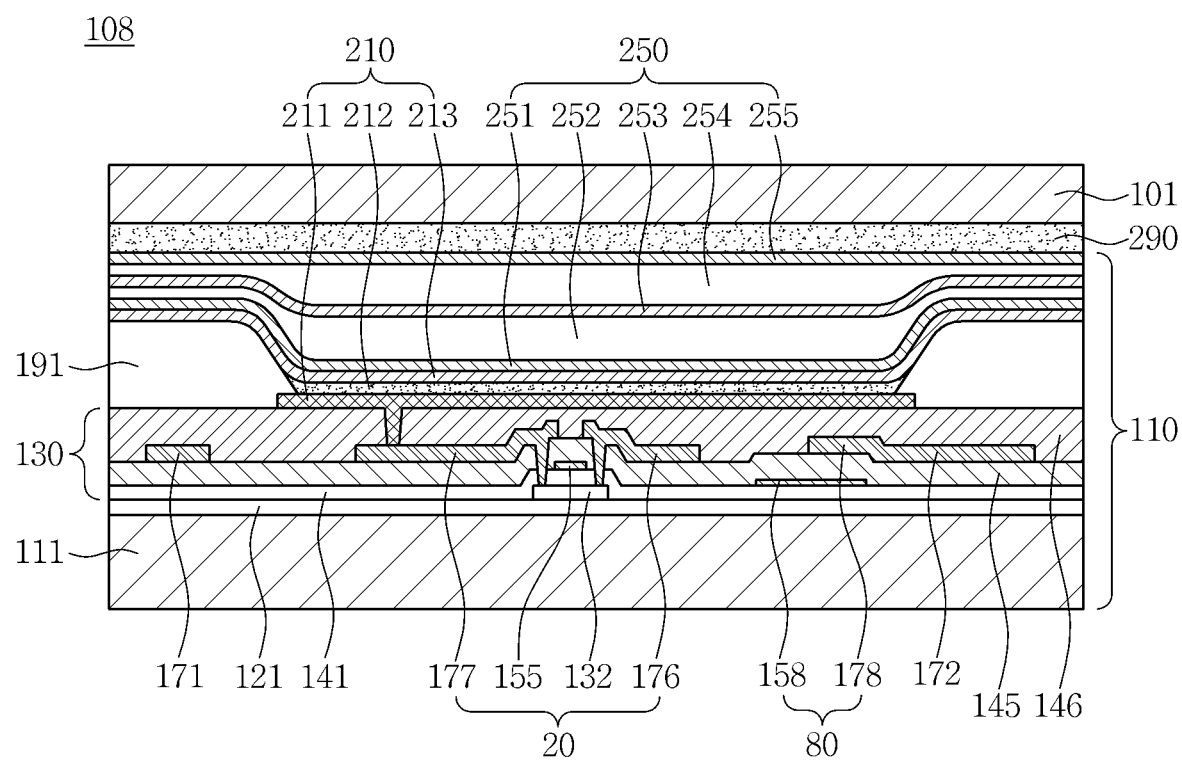
FIG. 9 is a plan view illustrating a display device according to an eighth exemplary embodiment.

Hereinafter, an eighth exemplary embodiment will be described with reference to FIG. 9. FIG. 9 is a plan view illustrating a display device 108 according to the eighth exemplary embodiment.

The display device 108 according to the eighth exemplary embodiment includes a thin film encapsulation film 250 on the OLED 210.

The thin film encapsulation layer 250 includes one or more inorganic layers 251, 253, and 255 and one or more organic layers 252 and 254. The thin film encapsulation layer 250 has a structure in which the inorganic layers 251, 253, and 255 and the organic layers 252 and 254 are alternately stacked. In this case, the inorganic layer 251 may be disposed as a lowermost layer of the stacked structure of the thin film encapsulation layer 250. In other words, the inorganic layer 251 may be disposed to be most adjacent to the OLED 210. Although FIG. 9 illustrates the thin film encapsulation layer 250 as including the three inorganic layers 251, 253, and 255 and the two organic layers 252 and 254, the exemplary embodiment is not limited thereto.

The inorganic layers 251, 253, and 255 may include one or more of the following inorganic materials: $Al_2O_3$, $TiO_2$, $ZrO$, $SiO_2$, $AlON$, $AlN$, $SiON$, $Si_3N_4$, $ZnO$, $Ta_2O_5$, $SiO_x$ ($0<x\leq 2$), and $SiN_x$ ($0<x\leq 3/4$). The inorganic layers 251, 253, and 255 may be formed through a chemical vapor deposition (CVD) process or an atomic layer deposition (ALD) process. However, the eighth exemplary embodiment is not limited thereto, and the inorganic layers 251, 253, and 255 may be formed through various suitable processes available in the pertinent art.

The organic layers 252 and 254 may include or be formed of a polymer-based material. Examples of the polymer-based material may include an acrylic resin, an epoxy resin, polyimide, polyethylene, and the like. The organic layers 252 and 254 may be formed through various suitable methods available to those skilled in the pertinent art, such as a thermal deposition process. The thermal deposition process for forming the organic layers 252 and 254 is performed in a temperature range that may not damage the OLED 210. However, the eighth exemplary embodiment is not limited thereto, and the organic layers 252 and 254 may be formed through various suitable methods available to those skilled in the pertinent art.

The inorganic layers 251, 253, and 255 formed to have a high density of a thin film may primarily serve to reduce or effectively prevent or reduce infiltration of moisture or oxygen thereinto. The infiltration of moisture or oxygen into the OLED 210 may be prevented or reduced largely by the inorganic layers 251, 253, and 255.

Moisture or oxygen passing through the inorganic layers 251, 253, and 255 may be blocked further by the organic layers 252 and 254. The organic layers 252 and 254 may exhibit relatively low efficiency in preventing or reducing the moisture infiltration, as compared to the inorganic layers 251, 253, and 255. However, the organic layers 252 and 254 may also serve as a buffer layer to reduce stress between respective layers of the inorganic layers 251, 253, and 255 and the organic layers 252 and 254, in addition to the prevention or reduction of the moisture infiltration. Further, since the organic layers 252 and 254 have a planarization property, an uppermost surface of the thin film encapsulation layer 250 may be planarized.

The thin film encapsulation layer 250 may have a thickness of about 10 µm or less. Accordingly, an overall thickness of the OLED display device 108 may be significantly reduced.

In a case where the thin film encapsulation layer 250 is disposed on the OLED 210, the second substrate 112 may be omitted. In a case where the second substrate 112 is omitted, the flexibility of the display device 108 may be improved.

As set forth above, according to exemplary embodiments, the plastic substrate includes the inorganic layer and the organic-inorganic hybrid layer on the plastic support member, thus having excellent hardness and abrasion-resistance. Further, the plastic substrate according to exemplary embodiments is used as the window of the display device, thus allowing the display device to be light-weighted.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

From the foregoing, it will be appreciated that various embodiments in accordance with the present disclosure have been described herein for purposes of illustration, and that various modifications may be made without departing from the scope and spirit of the present disclosure. Accordingly, the various embodiments disclosed herein are not intended to be limiting of the true scope and spirit of the present disclosure. Various features of the above described and other embodiments can be mixed and matched in any manner, to produce further embodiments consistent with the present disclosure. The present disclosure is intended to cover various modifications and equivalent arrangements included within the spirit and scope of the appended claims, and equivalents thereof.

What is claimed is:

1. A method of manufacturing a plastic substrate, the method comprising:
    immersing a transparent plastic support member in a coating solution for forming an inorganic layer and thereby forming a first inorganic layer and a second inorganic layer on respective sides of the transparent plastic support member; and
    immersing the transparent plastic support member formed with the first inorganic layer and the second inorganic layer in a coating solution for forming an organic-inorganic hybrid layer and thereby forming a first organic-inorganic hybrid layer and a second organic-inorganic hybrid layer on the first inorganic layer and the second inorganic layer, respectively, wherein the coating solution for forming an organic-inorganic hybrid layer further comprises fluorine (F) in an amount of about 0.001 wt % to about 0.2 wt % with respect to the total weight of the coating solution for forming an organic-inorganic hybrid layer, wherein the coating solution for forming an inorganic layer comprises a silicone monomer comprising a silicon oxide moiety and a coupling moiety, and the coating solution for forming an organic-inorganic hybrid layer comprises an organic binder component and inorganic particles dispersed in the organic binder component.

2. The method of claim 1, wherein the silicone monomer comprises at least one selected from a monomer represented by the following Chemical Formula 5 and a monomer represented by the following Chemical Formula 6:

Chemical Formula 5

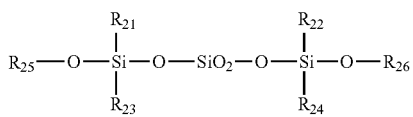

wherein in Chemical Formula 5, each of R21, R22, R23, and R24 is one selected from an amino group, an epoxy group, a phenyl group, an acrylic group, and a vinyl group, at least one selected from R21, R22, R23, and R24 is one selected from an acrylic group and a vinyl group, and each of R25 and R26 is one selected from hydrogen (H) and a hydrocarbon group having 1 to 6 carbon atoms.

film, a polyethylene terephthalate (PET) film, a polybutylene terephthalate (PBT) film, a polycarbonate (PC) film, a cellulose film, and a moisture-resistant cellophane.

5. The method of claim 1, wherein the transparent plastic support member comprises a copolymer of polycarbonate (PC) and polymethyl methacrylate (PMMA), and polycarbonate (PC) is present in an amount of about 50 wt % to about 70 wt % and polymethyl methacrylate (PMMA) is present in an amount of about 30 wt % to about 50 wt %, with respect to the total weight of the copolymer of polycarbonate (PC) and polymethyl methacrylate (PMMA).

6. The method of claim 1, wherein the organic binder component comprises a monomer, an oligomer, and a photoinitiator, and the monomer comprises at least one selected from an acrylic monomer and a urethane monomer.

7. The method of claim 1, wherein the inorganic particles comprise at least one selected from a silica particle, zirconium oxide, aluminum oxide, tantalum oxide, and nickel oxide.

8. The method of claim 1, wherein the inorganic particle is present in an amount of about 30 wt % to about 50 wt % with respect to the total weight of the coating solution for forming an organic-inorganic hybrid layer.

9. The method of claim 1, wherein the forming of the inorganic layer comprises:
immersing the transparent plastic support member in the coating solution for forming an inorganic layer and thereby forming an inorganic coating layer on the transparent plastic support member; and
thermal-curing the inorganic coating layer.

10. The method of claim 9, wherein the thermal-curing is performed at a temperature of about 60° C. to about 120° C.

Chemical Formula 6

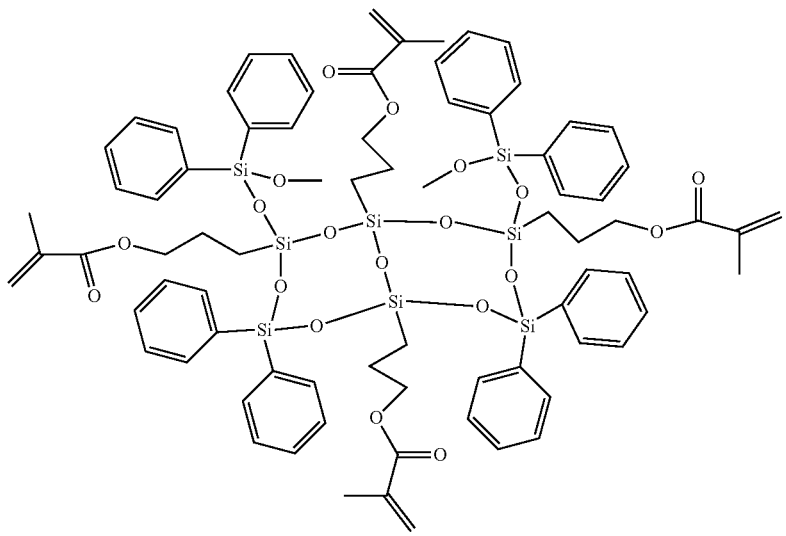

3. The method of claim 1, wherein the coupling moiety is present in an amount of about 5 wt % to about 15 wt % with respect to the total weight of the coating solution for forming an inorganic layer.

4. The method of claim 1, wherein the transparent plastic support member comprises one selected from the group consisting of: a polyethylene (PE) film, a polypropylene (PP) film, a polyamide (PA) film, a polyacetal (polyoxymethylene, POM) film, a polymethyl methacrylate (PMMA)

11. The method of claim 1, further comprising forming an organic layer on the transparent plastic support member prior to or subsequent to the forming of the first inorganic layer and the second inorganic layer.

12. The method of claim 11, wherein the organic layer comprises at least one selected from an acrylic resin, a urethane resin, and a urethane-acrylate resin.

* * * * *